United States Patent [19]

Miyake et al.

[11] Patent Number: 5,523,710
[45] Date of Patent: Jun. 4, 1996

[54] INITIAL VALUE SETTING CIRCUIT

[75] Inventors: Naomi Miyake, Kyoto; Makoto Kojima, Osaka, both of Japan

[73] Assignee: Matsushita Electric Industrial Co., Ltd., Osaka, Japan

[21] Appl. No.: 441,923

[22] Filed: May 16, 1995

[30] Foreign Application Priority Data

May 17, 1994 [JP] Japan .................................. 6-102910

[51] Int. Cl.⁶ ...................................................... H03K 3/02
[52] U.S. Cl. ................................................ 327/198; 327/142
[58] Field of Search ........................................ 327/198, 142, 327/544

[56] References Cited

U.S. PATENT DOCUMENTS 5,450,417  9/1995  Truong et al. ........................... 327/198
5,467,037  11/1995  Kumar et al. ........................... 327/198

FOREIGN PATENT DOCUMENTS 000285033  10/1988  Japan ...................................... 327/143
62169022   1/1989   Japan .
406097797  4/1994   Japan ...................................... 327/143

Primary Examiner—Margaret Rose Wambach
Attorney, Agent, or Firm—Willian Brinks Hofer Gilson & Lione

[57] ABSTRACT

A voltage level of an output node is reversed by an inverter. An output of the inverter is used as an initial setting signal. A feedback switching transistor is also provided in an initial value setting circuit. Furthermore, there is provided a limiting device for eliminating an abnormal operation of the feedback switching transistor until the inverter starts a normal operation, in the event of momentary power failure or when the electric power source is quickly turned on after a very short break. Accordingly, normal operation of the inverter is assured even in such an abnormal condition accompanying momentary interruption of power supply, thereby surely outputting an initial setting signal.

7 Claims, 10 Drawing Sheets

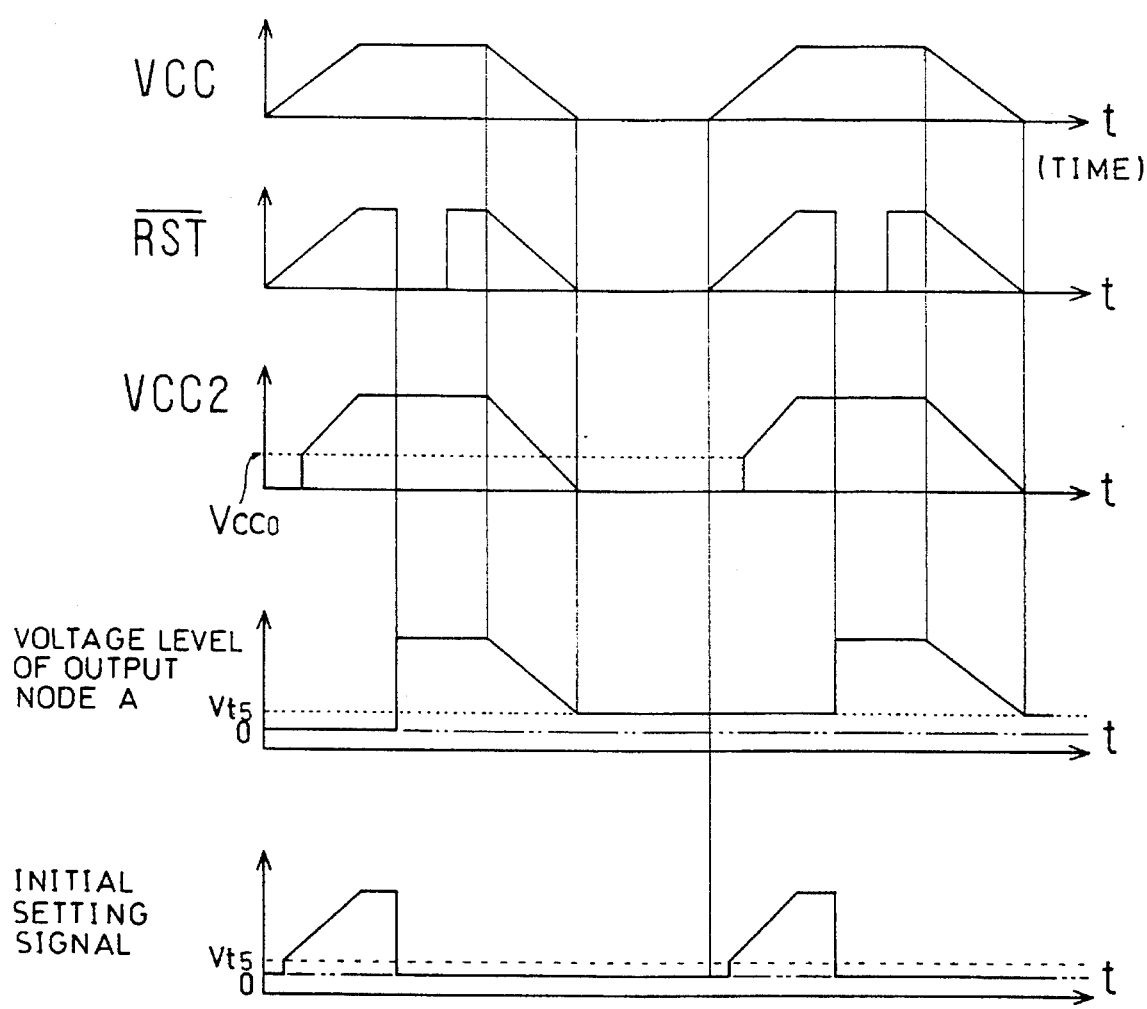

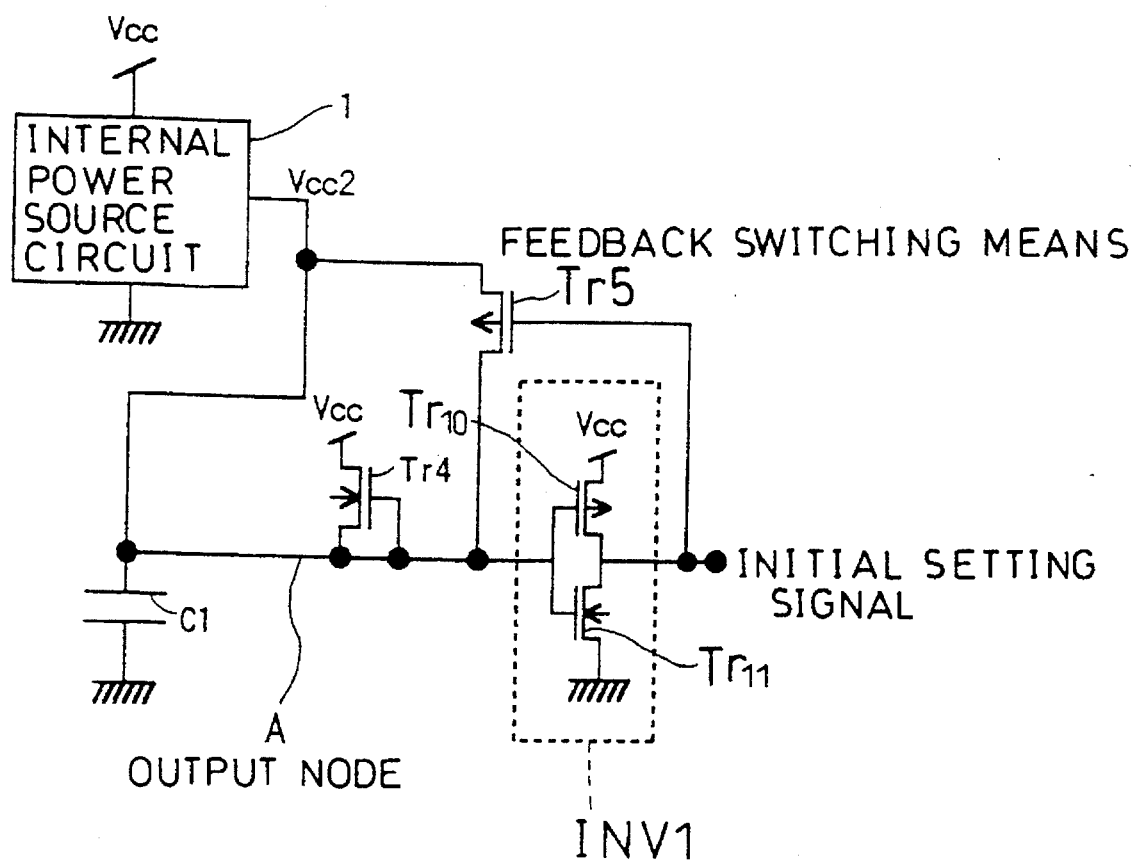

INITIAL VALUE SETTING CIRCUIT

BACKGROUND OF THE INVENTION

The present invention relates to an improvement of an initial value setting circuit, by which an operational condition of an internal circuit of a semiconductor integrated circuit can be univocally determined to a predetermined initial condition, in order to eliminate any erroneous operations of this internal circuit when the electric power unit is turned on.

FIG. 8 shows one example of a conventionally available initial value setting circuit, which will be explained in detail below.

In the initial value setting circuit of FIG. 8, reference numeral 50 represents an input terminal into which an initial-condition-reset signal is entered, and reference numeral 51 represents an N-channel MOS transistor connected to an electric power source Vcc. A gate of the N-channel MOS transistor 51 is connected to the input terminal 50. Reference numeral 52 represents a capacitor which receives electric charges supplied From the electric power source Vcc in response to a turning-on operation of the MOS transistor 51. Reference numeral 53 represents an output node which is in the same voltage level as a connecting point between the N-channel MOS transistor 51 and the capacitor 52. Reference numeral 54 represents a P-channel MOS transistor connected to the output node 53. A gate of the P-channel MOS transistor 54 is connected to the electric power source Vcc. Reference numeral 55 represents an inverter connected to the node 53.

Furthermore, reference numeral 60 represents a set & reset circuit, which comprises an output terminal 56, a signal line 57 whose operational condition (i.e. voltage level) is not univocally determined at the moment immediately after the electric power unit is turned on, and an OR circuit 58 interposed between the output terminal 56 and the signal line 57. Of two input terminals of OR circuit 58, one terminal is connected to the signal line 57 and the other terminal is connected to the output terminal of the inverter 55.

According to the conventional initial value setting circuit shown in FIG. 8, a voltage level of the input terminal 50, i.e. a voltage level of a processing condition reset signal, is in a low level when the electric power unit is turned on. Accordingly, the N-channel MOS transistor 51 is turned off. A voltage level of the output node 53 is in a low level due to capacity coupling of the capacitor 52. Thus, the inverter 55 generates an initial setting signal of high level. As a result, the set & reset circuit 60 generates a high-level voltage from its output terminal 56. Hence, a voltage level of an internal circuit of a semiconductor integrated circuit is set to a high level as an initial setting value. In this condition, the P-channel MOS transistor 54 is turned off under the application of the voltage of the electric power source Vcc.

Thereafter, when the voltage level of the input terminal 50 becomes a high level, the N-channel MOS transistor 51 is turned on to charge up the capacitor 52. Thus, the output node 53 is turned to a high level, and the output of the inverter 55 becomes a low level, thereby stopping generation of the initial setting signal of high level. As a result, the internal circuit of the semiconductor integrated circuit changes its operational condition in response to the voltage level of the signal line 57. After the reset of the above-described initial setting condition, the voltage level of the input terminal 50 is changed to a low level to turn off the N-channel MOS transistor 51, thereby stopping the charging of capacitor 52.

On the other hand, when the electric power unit is turned off, the gate voltage of the P-channel MOS transistor 54 becomes 0 v. Thus, the P-channel MOS transistor 54 is turned on. In response to the turning-on of the transistor 54, electric charge stored in the capacitor 52 is discharged through the P-channel MOS transistor 54 to the ground. Thus, the voltage level of the output node 53 is returned to the initial condition of low level.

However, the above-described conventional initial value setting circuit is defective in the following points. Namely, after the initial condition of the internal circuit of the semiconductor integrated circuit is reset (i.e. when the output node 53 is in a high level condition), electric charge stored in the capacitor 52 is reduced by leakage. If such leakage is increased, the voltage level of the output node 53 may be changed from high level to low level. For this reason, the inverter 55 will generate tile initial setting signal (high level), which turns the voltage level of the output terminal 56 of the set & reset circuit 60 to a high level. Hence, there is a problem that the internal circuit of the semiconductor integrated circuit may be erroneously set to a high level as an initial setting.

To solve this problem it will be, for example, possible to propose a modified initial value setting circuit shown in FIG. 9 as an improvement of FIG. 8 circuit.

The initial value setting circuit shown in FIG. 9 is basically different from FIG. 8 circuit in that the P-channel MOS transistor 54 is removed and a feedback transistor 70 constituted by a P-channel transistor is newly added.

The feedback transistor 70 is connected between the electric power source Vcc and the output node 53. A gate of the feedback transistor 70 is connected to the output terminal of the inverter 55. Accordingly, when the output node 53 is kept at a high level by electric charges stored in the capacitor 52, i.e. when the output of the inverter 55 is in a low level, the feedback transistor 70 is turned on. Thus, electric charge is supplied from she electric power source Vcc to the capacitor 52, thereby maintaining the output node 53 at a high level. Furthermore, when the electric power unit is turned off, electric charge stored in the capacitor 52 is discharged through the output node 53 and the feedback transistor 70.

In FIG. 9, reference symbol/RST represents an initial-condition-reset signal entered into the input terminal 50. This input terminal 50 is connected to the transistor 51 which is constituted by a P-channel transistor. Furthermore, the inverter 55 comprises a P-channel transistor 55a connected to the electric power source Vcc and an N-channel transistor 55b connected to the ground, the P-channel transistor 55a and the N-channel transistor 55b being connected in parallel with each other. Moreover, a set & reset circuit 71 comprises a NAND circuit 71a having two input terminals receiving signals B and C whose voltage levels cannot be univocally determined at the moment immediately after the electric power unit is turned on and a NOR circuit 71b having two input terminals receiving an output signal of the NAND circuit 71a and the output signal of the inverter 55. Using a high-level output of the inverter 55 as an initial setting signal makes the NOR circuit 71b of the set & reset circuit 71 generate a low-level output, thereby performing an initial setting of the operational condition of the internal circuit of the semiconductor integrated circuit.

However, such an initial value setting circuit proposed above is still defective in that the initial setting of the internal circuit cannot be performed in the event of momentary power failure or when the electric power unit is quickly turned on immediately after the electric power unit is once turned off. The reasons are explained as follows.

When the internal circuit is in a condition where the initial setting is reset, the output node 53 receives electric charges from the electric power source Vcc in response to the turning-on of the feedback transistor 70 as described above. Thus, the voltage level of the output node 53 is in a high level, while the output of the inverter 55 is in a low level. Therefore, the initial setting signal is reset. If the electric power unit is turned off in this condition, the voltage value of the electric power source Vcc is reduced to 0 v. Thus, electric charge stored in the capacitor 52 is discharged through the feedback transistor 70 to the electric power source, and the voltage level of the output node 53 is lowered. However, when the voltage level of the output node 53 is reduced down to a threshold voltage Vt of the feedback transistor 70, the feedback transistor 70 is turned off. Hence, the voltage level of the output node 58 is not equalized to 0 v, and the threshold voltage Vt is held. The electric charges forming such a residual voltage Vt are gradually leaked from the capacitor 52 with elapsing time. Then, the voltage of the output node 53 will be shortly equalized to 0 v.

If the electric power unit is subsequently turned on under such a condition as is so in an ordinary operation, the output signal of the inverter 5S becomes a high level. More specifically, the electric power source Vcc is applied through the P-channel transistor 55a of the inverter 55 to situate the inverter 55 in a high-level condition. Thus, the initial setting signal is output.

On the other hand, in the event of momentary power failure or when the electric power unit is quickly turned on after a very short break, the voltage level of the output node 53 is still maintained at a value substantially the same as the threshold voltage Vt. Meanwhile, the output terminal of the inverter 55 is connected through the N-channel transistor 55b to the ground level; thus, the voltage level of the output terminal of the inverter 55 is in a ground level. If the voltage value of the electric power source Vcc starts increasing from 0 v under this condition, the feedback transistor 70 will be turned on at the moment that the voltage value of the electric power source Vcc exceeds the threshold voltage Vt of the feedback transistor 70. Hence, electric charge is supplied from the electric power source Vcc to the output node 53. The voltage level of the output node 53 increases up to the voltage value of the electric power source Vcc as shown in FIG. 10 and becomes a high level. Consequently, in the inverter 55, the P-channel transistor 55a is turned off and the N-channel transistor 55b is turned on, thereby maintaining an output of low level. Thus, the initial setting signal (which should be inherently obtained as a high-level output signal, as shown by an alternate long and short dash line in FIG. 10) cannot be obtained. Accordingly, it is impossible to perform the initial setting of the internal circuit of the semiconductor integrated circuit in the special occasions such as momentary power failure or quick turning-on of electric power unit after a very short break.

According to the above initial value setting circuit, the output node 53 is in a low level in the initial condition and is changed to a high level in response to the reset operation. It is of course possible to replace this circuit by another type initial value setting circuit characterized in that the output node 53 is in a high level in the initial condition and is changed to a low level in response to the reset operation. However, adoption of such an initial value setting circuit will not yet effective to eliminate the problems encountered in the above-described initial value setting circuit, as long as it includes the above-described feedback transistor.

SUMMARY OF THE INVENTION

Accordingly, in view of above-described problems encountered in the prior art, a principal object of the present invention is to provide an initial value setting circuit which includes a feedback switching means such as a feedback transistor, and is capable of surely generating an initial setting signal regardless of occurrences of momentary power failure or quick turning-on of electric power unit after a very short break.

In order to accomplish this and other related objects, in view of the fact that the cause of the conventional problem is related to a malfunction of the feedback switching means derived from the abnormal operation of the inverter at the duration that the inverter has not yet started its normal operation when the electric power supply is momently interrupted or when the electric power unit is quickly turned on after a very short break, the present invention provides a novel initial value setting circuit employing an arrangement assuring a normal operation of the feedback switching means even if the electric power supply is momently interrupted or when the electric power unit is quickly turned on after a very short break.

More specifically, the present invention provides an initial value setting circuit comprising: an output node; a capacitor for setting a voltage level of the output node to a predetermined initial setting level; an initial-condition-reset switching means, controlled by an initial-condition-reset signal supplied from an external device, for setting the voltage level of the output node to another setting level different from the predetermined initial setting level; an inverter having an input stage connected to the output node and an output stage generating a voltage level opposed to the voltage level of the output node; a feedback switching means, controlled by an output of the inverter, for maintaining the voltage level of the output node; and a limiting means for limiting operations of the initial-condition-reset switching means and the feedback switching means until a voltage level of an electric power source reaches a predetermined threshold level assuring a normal operation of the inverter, when the voltage level of the electric power source is increased up to a specified value in response to turning-on operation of the electric power source.

With above arrangement, the present invention prevents the feedback switching means from operating abnormally before the inverter starts its normal operation in the event of momentary power failure or when the electric power unit is quickly turned on after a very short break. Hence, the initial setting of the internal circuit of the semiconductor integrated circuit can be surely performed even if the electric power supply is momently interrupted.

Furthermore, according to the present invention, the operation of the limiting means is stopped as soon as the voltage value of the electric power source reaches a threshold value assuring a normal operation of the inverter when the electric power source is turned on. Thus, it is possible to utilize the deactivation of the limiting means as a reset signal for resetting the initial condition. Thus, using the deactivation of the limiting means, it becomes possible to reset the initial setting of the internal circuit of the semiconductor integrated circuit.

BRIEF DESCRIPTION OF THE DRAWINGS

The above and other objects, features and advantages of the present invention will become more apparent from the following detailed description which is to be read in conjunction with the accompanying drawings, in which:

FIG. 3 is a view illustrating an operation of the first embodiment of the present invention;

FIG. 6 is a circuit diagram showing an initial value setting circuit in accordance with a fourth embodiment of the present invention;

DETAILED DESCRIPTION OF THE PREFERRED EMBODIMENT

Hereinafter, preferred embodiments of the present invention will be explained in greater detail with reference to the accompanying drawings.

(First Embodiment)

Figure 1:
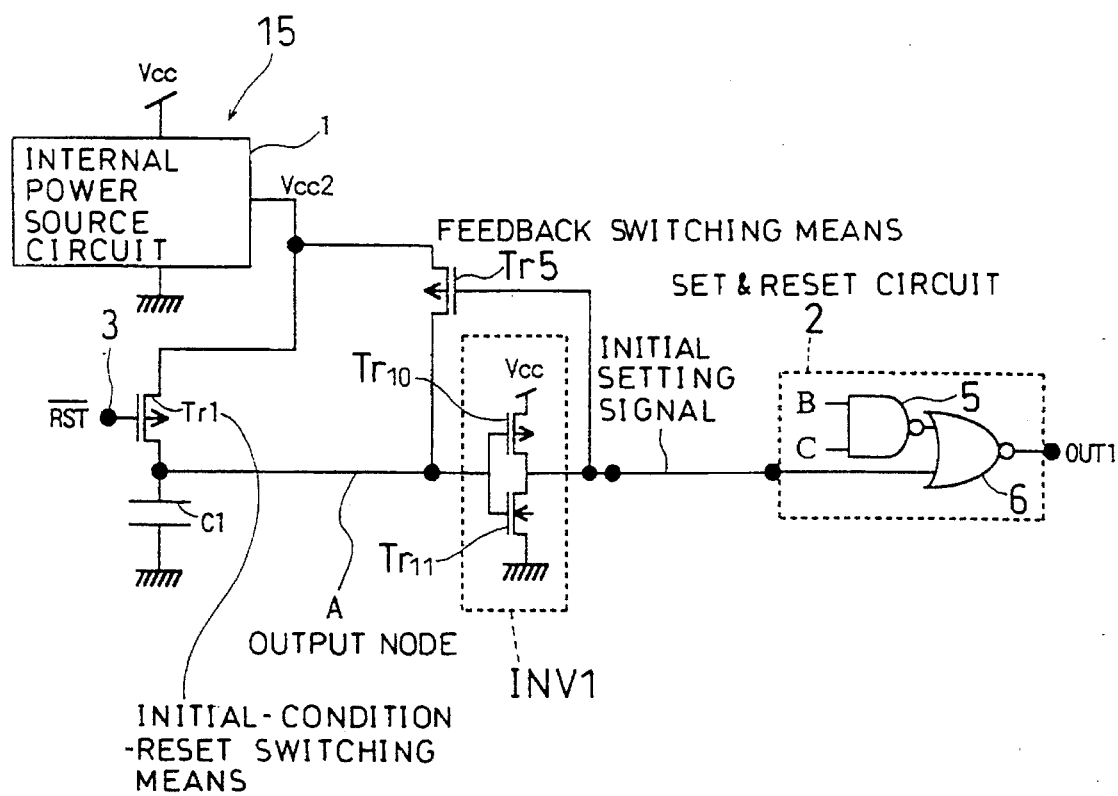
FIG. 1 is a circuit diagram showing an initial value setting circuit in accordance with a first embodiment of the present invention.

A first embodiment of the present invention will be explained hereinafter with reference to FIG. 1. FIG. 1 shows an initial value setting circuit in accordance with the first embodiment of the present invention. In the drawing, reference numeral 1 represents an internal power source circuit which is connected to an electric power source Vcc and is not activated until a voltage value of the electric power source Vcc increases a predetermined value. Reference numeral 3 represents an input terminal which receives an initial-condition-reset signal/RST to reset the initial set value for the initial value setting circuit. Reference symbol Tr1 represents an initial-condition-reset switching means constituted by a P-channel transistor, which has a gate connected to the input terminal 3 receiving the initial-condition-reset signal/RST and a drain connected to the internal power source circuit 1. Time variation of the initial-condition-reset signal/RST is shown in detail in FIG. 3.

Reference symbol C1 represents a capacitor having one end connected to the ground. Reference symbol INV1 represents an inverter which generates an output voltage opposed to the voltage level of its input stage. This inverter INV1 comprises a P-channel MOS transistor Tr10 connected to the electric power source Vcc and the N-channel Tr10 transistor Tr11 connected to the ground. The P-channel MOS transistor Tr10 and the N-channel MOS transistor Tr11 are connected in series.

Reference symbol A represents an output node which is connected to the other end of the capacitor C1, a source of the initial-condition-reset switching means Tr1, and the input stage of the inverter INV1. Accordingly, the capacitor C1 performs the initial setting of the output node A when the electric power source is turned on, so that the voltage level of the output node A is set to the ground level (i.e. setting voltage level). The initial-condition-reset switching means Tr1 is turned on when the initial-condition-reset signal/RES is in a low level, so that an output voltage of the internal power source circuit 1 is applied to the output node A. Hence, the output node A is set to a high level (i.e. a voltage different from the setting voltage set in the above initial setting).

Furthermore, reference symbol Tr5 represents a feedback switching means constituted by a P-channel transistor. The feedback switching means Tr5 has a drain connected to the internal power source circuit 1, a source connected to the output node A, and a gate connected to the output stage of the inverter INV1. Therefore, the feedback switching means Tr5, when it is turned on (i.e. when the output of the inverter INV1 is in a lower level), applies the output voltage of the internal power source circuit 1 to the output node A, thereby maintaining the output node A at the high level (i.e. the voltage different from the setting voltage set in the above initial setting).

Moreover, reference numeral 2 represents a set & reset circuit which includes a NAND circuit 5 having two input terminals connected to two signal lines B and C whose voltage levels cannot be univocally determined at the moment immediately after the electric power unit is turned on, and a NOR circuit 6 having two input terminals receiving an output signal of the NAND circuit 5 and the output signal of the inverter INV1. The output stage of the NOR circuit 6 is connected to an output terminal OUT1.

Figure 2:
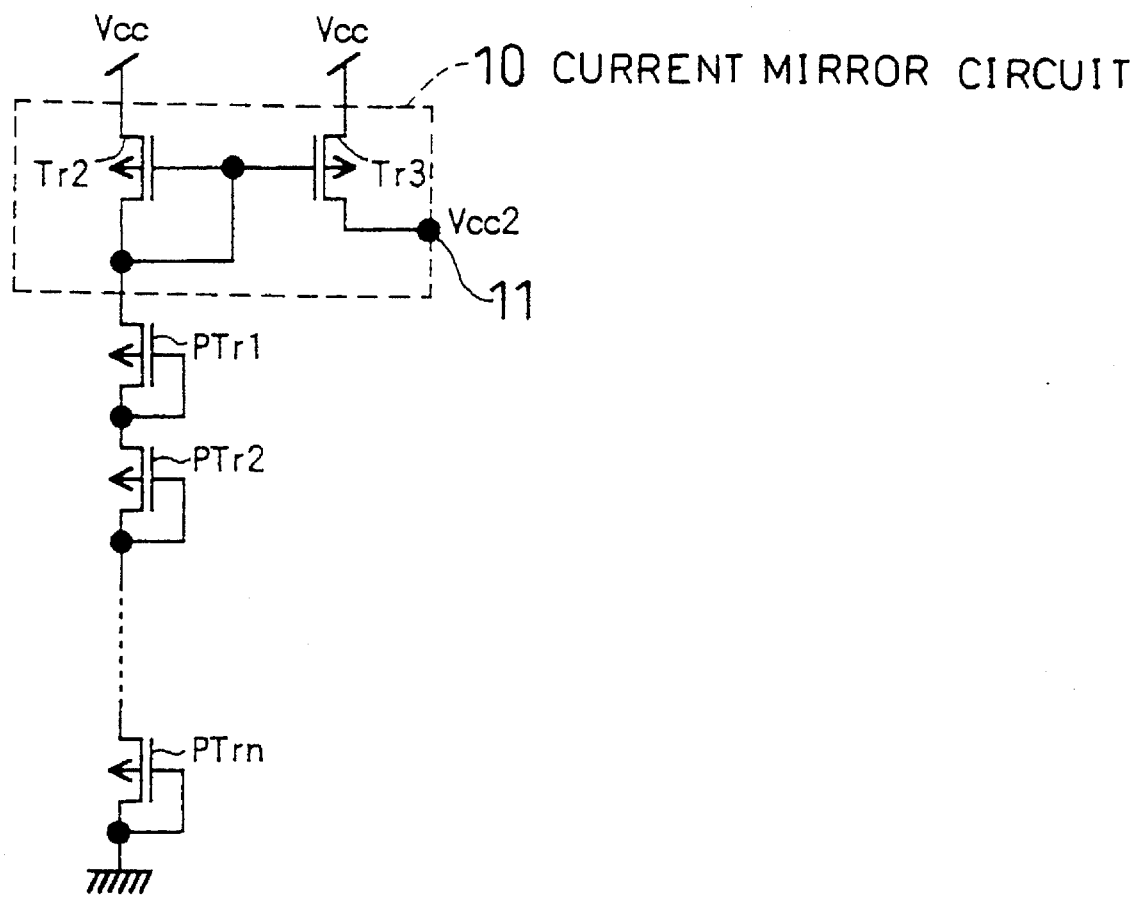
FIG. 2 is a circuit diagram showing a detailed arrangement of an internal power source circuit of FIG. 1.

FIG. 2 shows a detailed arrangement of the internal power source circuit 1. Two transistors Tr2 and Tr3, to which the voltage of the electric power source Vcc is applied, are P-channel MOS transistors which cooperatively constitute a current mirror circuit 10. Reference symbols PTr1 through PTrn are a plurality of (a total of n) P-channel MOS transistors interposed between the transistor Tr2 of the current mirror circuit 10 and the ground. These transistors PTr1 through PTrn determine a boundary voltage for turning-on and off the other transistor Tr3 of the current mirror circuit 10. When the voltage value of the electric power source Vcc exceeds a setting voltage Vcc0, two transistors Tr2 and Tr3 cooperatively constituting the current mirror circuit 10 are turned on. In this case, the setting voltage Vcc0 is defined by the following equation.

$$Vcc0=(Vpt1+Vpt2+ \text{---} +Vptn)+Vt1$$

where $(Vpt1+Vpt2+ \text{---} +Vptn)$ represents a sum of threshold voltages of the transistors PTr1 through PTrn, and Vt1 represents a threshold voltage of the transistor Tr2 in the current mirror circuit 10. The other transistor Tr3 of the current mirror circuit 10 is connected to an output terminal 11 of the current mirror circuit 10. The output terminal 11 generates a voltage Vcc2 identical with the voltage value of the electric power source Vcc when the two transistors Tr2 and Tr3 are both turned on. A series of these transistors PTr1 through PTrn not only has a function of setting the boundary voltage of turning-on and off the other transistor Tr3 in the current mirror circuit 10 but has a function of suppressing the value of current flowing from the electric power source Vcc to the ground.

Accordingly, with above arrangement, the internal power source circuit 1 is activated only when the voltage value of the electric power source Vcc reaches the setting voltage Vcc0. The setting voltage Vcc0 is larger than a minimum voltage value necessary for assuring an ordinary or normal operation of the inverter INV1. Therefore, the internal power circuit 1 constitutes a limiting means 15 for limiting the operation of the feedback switching means Tr5. More specifically, when the electric power source Vcc is turned on, the voltage value of the electric power source Vcc increases up to a specified value. In this moment, there is a possibility that the feedback switching means Tr5 may be erroneously turned on. However, the limiting means 15 of the present embodiment suppresses the feedback switching means Tr5 from operating to apply any voltage to the output node A unless the voltage value of the electric power source Vcc reaches the setting voltage Vcc0.

An operation of the above-described initial value setting circuit in accordance with the present embodiment will be explained with reference to FIG. 3.

First of all, an ordinary operation will be explained. When the electric power unit is turned on, the initial-condition-reset signal/RST is in a high level. At this moment, the initial-condition-reset switching means Tr1 is turned off. Accordingly, the level of the output node A is in a low level due to capacity coupling by the capacitor C1. As a result, the inverter INV1 generates an initial setting signal of high level. The set reset circuit 2 generates a low-level output from its output terminal OUT1. Thus, the internal circuit of the semiconductor integrated circuit is set to an initial setting condition of low level.

Thereafter, under the condition where the voltage of the electric power source Vcc maintains a specified value (e.g. 3 V), the level of the initial-condition-reset signal/RST becomes a low level. Hence, the initial-condition-reset switching means Tr1 is turned on, and electric charge is supplied from the electric power source Vcc to the capacitor C1 through the internal power source circuit 1 and the initial-condition-reset switching means Tr1. Thus, the capacitor C1 being charged in this manner by the electric charge supplied from the electric power source Vcc shortly makes the output node A change its level from a low level to a high level. As a result, the inverter INV1 generates an output of low level, which stops generation of the initial setting signal, thereby resetting the initial setting signal. Therefore, the output terminal OUT1 of the set & reset circuit 2 generates an output signal variable in accordance with change of levels of the signal lines B and C. Thus, the internal circuit of the semiconductor circuit changes its operational condition in accordance with the level of signal lines B and C. In this condition, the feedback switching means Tr5 is turned on, and electric charge is supplied from the internal power source circuit 1 to the capacitor C1 through the feedback switching means Tr5. Hence, the output node A is maintained at a high level, and the inverter INV1 continues stopping generation of the initial setting signal.

Now let us suppose that the electric power source is momently interrupted due to power failure or quick turning-on after a very short break under the above-described condition. In the event of such a momentary interruption of electric power supply, the voltage level of the electric power source Vcc is reduced for a short time, making the electric charge stored in the capacitor C1 discharge through the output node A and the feedback switching means Tr5. This discharge is ceased at the time the voltage value of the output node A is decreased below the threshold voltage Vt5 of the feedback switching means Tr5. Thus, the feedback switching means Tr5 is turned off, and the voltage level of the output node A is maintained at this threshold voltage Vt5.

Subsequently, even if the electric power source Vcc starts raising its voltage value, the internal power source circuit 1 is not activated unless the voltage value of the electric power source Vcc reaches the setting voltage Vcc0. Thus, the output terminal 11 of the internal power source circuit 1 is in high impedance state. Accordingly, in the inverter INV1, the voltage of the electric power source Vcc is applied to its output stage through the P-channel transistor Tr10, even if the voltage level of its input stage is equal to the threshold voltage Vt5 of the feedback switching means Tr5 identical with the voltage level of the output node A. Then, in response to increase of the voltage level of the electric power source Vcc, the inverter INV1 shortly generates an initial setting signal of high level. Hence, the set & reset circuit 2 generates an output of low level from its output terminal OUT1. Consequently, the internal circuit of the semiconductor circuit is surely and univocally set at this low level as an initial setting condition. In this case, the feedback switching means Tr5 is turned off in response to a high-level output of the inverter INV1. Thus, the output of the internal power source circuit 1 is not applied to the output node A. Even if the feedback switching means Tr5 is in a turning-on condition, the internal power source circuit 1 is not yet activated as described previously. Hence, the output terminal 11 is in high impedance state. Thus, the voltage level of the output node A is maintained at a low level. Furthermore, in such a condition where the voltage value of the electric power source Vcc is less than the setting voltage Vcc0, the initial-condition-reset signal/RST may be quickly turned to a low level despite of increase of the voltage value of the electric power source Vcc. (Refer to FIG. 3) In such a case, the initial-condition-reset switching means Tr1 is turned on. However, the internal power source circuit 1 is not activated yet. And, the output terminal 11 is in high impedance state. Thus, the voltage level of the output node A is maintained at a low level.

Thereafter, as soon as the voltage level of the electric power source Vcc reaches the setting voltage Vcc0, the internal power source circuit 1 is activated. Thus, the voltage level of the output terminal 11 becomes identical with the voltage value of the electric power source Vcc. Accordingly, the capacitor Cl is charged by electric charges supplied from the internal power source circuit 1 through the initial-condition-reset switching means Tr1, thereby turning the level of the output node A to a high level. Thus, the output of the inverter INV1 turns to a low level, resetting the initial setting signal of high level. The low-level output signal of the inverter INV1 is surely maintained by the function (ON condition) of the feedback switching means Tr5 regardless of later-occurring level changes of the initial-condition-reset signal/RST. Hence, the output terminal OUT1 of the set & reset circuit 2 generates an output voltage which is changeable in accordance with the levels of the signal lines B and C. Thus, it becomes possible to control the operating condition of the internal circuit of the semiconductor integrated circuit on the basis of the levels of the signal lines B and C.

(Second Embodiment)

Next, a second embodiment of the present invention will be explained with reference to FIGS. 4A and 4B.

Figure 4A:
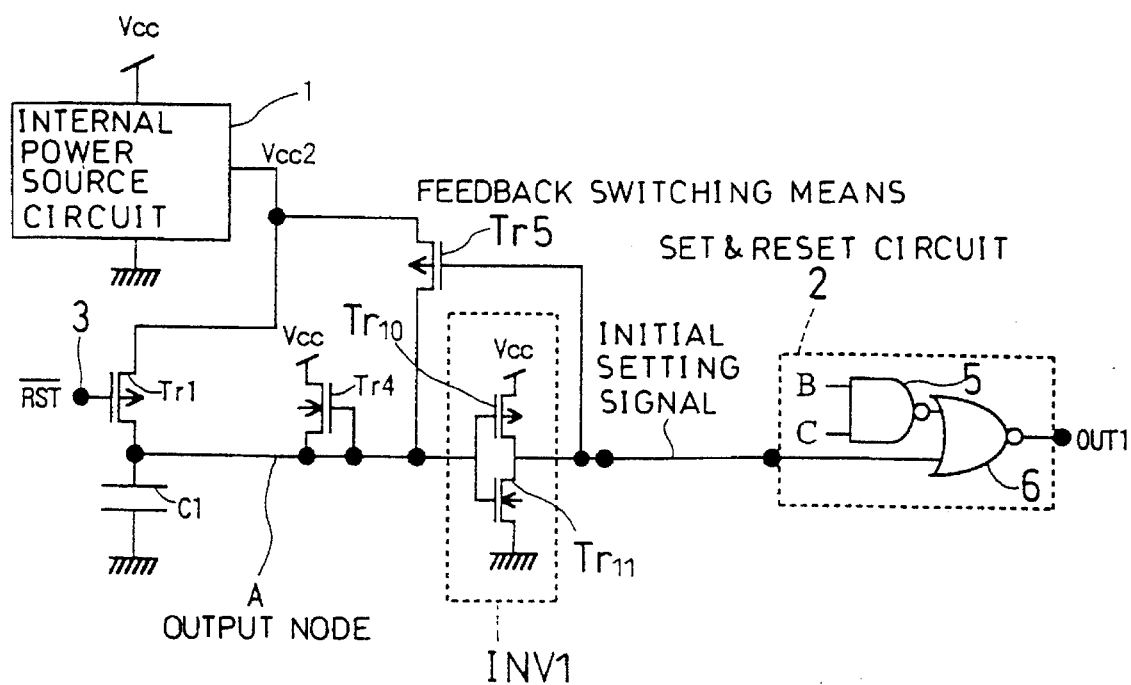
FIGS. 4A and 4B are circuit diagrams showing an initial value setting circuit in accordance with a second embodiment of the present invention.

FIG. 4A shows an initial value setting circuit in accordance with the second embodiment of the present invention, identical with the first embodiment circuit shown in FIG. 1 except that the output node A is connected to a source of other N-channel MOS transistor Tr4.

The N-channel MOS transistor Tr4 has a drain connected to the electric power source Vcc, and a gate and a source respectively connected to the output node A. The MOS transistor Tr4 has a threshold voltage Vt4 lower than the threshold voltage Vt5 of the feedback switching means (MOS transistor) Tr5.

Accordingly, the second embodiment performs the function of an initial value setting circuit in the same manner as the first embodiment. In addition, the second embodiment can function in the following manner. When the electric power source is turned off in an ordinary operation or in the event of power failure or the like, the electric charge stored in the capacitor C1 is discharged through the feedback switching means Tr5. Of such discharged electric charge, a part is discharged through the MOS transistor Tr4. At the same time, the level of the output node A drops down to the threshold voltage Vt5 of the feedback switching means Tr5 and, therefore, the feedback switching means Tr5 is turned off. However, even if the feedback switching means Tr5 is turned off, the MOS transistor Tr4 keeps its turning-on condition until the voltage level of the output node A is decreased down to its own threshold voltage Vt4 (Vt4<Vt5). Hence, the MOS transistor Tr4 suppresses the voltage level of the output node A to be substantially equal to the threshold voltage Vt4, thereby surely maintaining the level of the output node A in a low level.

Figure 4B:
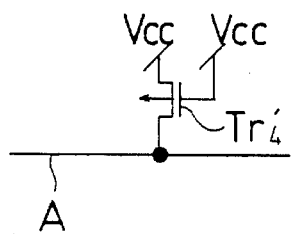

Although the MOS transistor Tr4 disclosed in FIG. 4 is an N-channel type, it is needless to say that this MOS transistor Tr4 can be replaced by a P-channel MOS transistor Tr4' as shown in FIG. 4B.

(Third Embodiment)

Next, a third embodiment of the present invention will be explained with reference to FIGS. 5A and 5B.

Figure 5A:
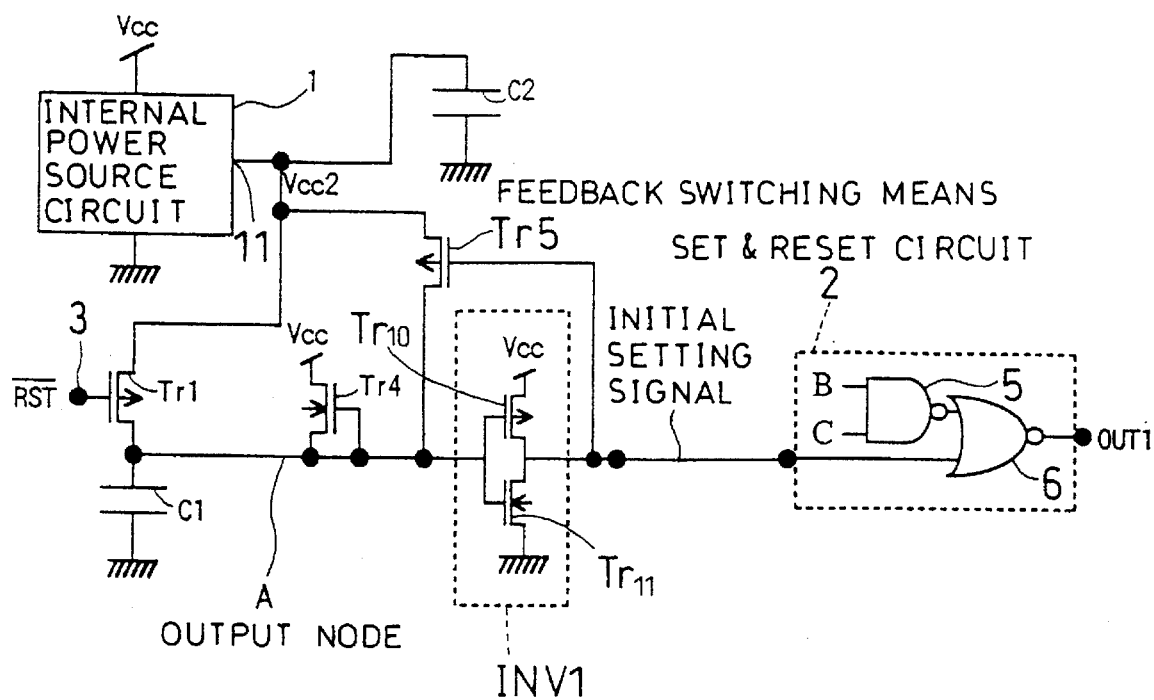
FIGS. 5A is a circuit diagram showing an initial value setting circuit in accordance with a third embodiment of the present invention.
Figure 5B:
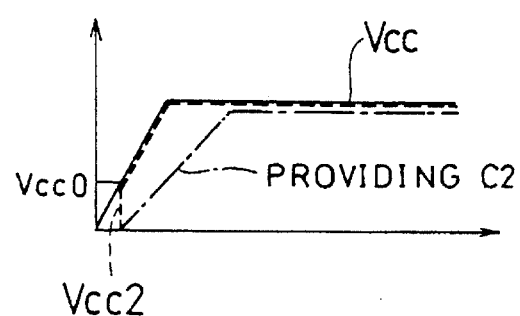
FIG. 5B is a graph showing an operation of the initial value setting circuit in accordance with the third embodiment of the present invention.

FIG. 5A shows an initial value setting circuit in accordance with the third embodiment of the present invention, identical with the second embodiment circuit shown in FIG. 4 except that there is provided another capacitor C2 having one end connected to the output terminal of the internal power source circuit 1 and the other end connected to the ground.

According to this embodiment, provision of the capacitor C2 brings the following effect. Namely, after the voltage level of the electric power source Vcc reaches the setting voltage Vcc0, increase of the voltage level Vcc2 to be applied from the output terminal 11 of the internal power source circuit 1 to the output node A can be arbitrarily changed as shown by an alternate long and short dash line in FIG. 5B.

(Fourth Embodiment)

A fourth embodiment of the present invention will be explained with reference to FIG. 6.

FIG. 6 shows an initial value setting circuit in accordance with the fourth embodiment of the present invention, identical with the second embodiment circuit shown in FIG. 4 except that the initial-condition-reset switching means Tr1 is removed. According to the fourth embodiment, the initial setting for the internal circuit of the semiconductor integrated circuit is performed using a 0 v output of the internal power source circuit 1 until the voltage value of the electric power source Vcc reaches the setting voltage Vcc0. Thereafter, when the voltage value of the electric power source Vcc exceeds the setting voltage Vcc0, the initial condition is reset by the output voltage of the electric power source Vcc supplied from the internal power source Vcc. The arrangement of the set & reset circuit 2 is the same as that of FIG. 4 (and FIG. 1), although not shown in FIG. 6.

An operation of this embodiment will be explained in greater detail. First of all, when the electric power unit is turned on in an ordinary operation, the output node A is in a low level in the beginning due to capacity coupling by the capacitor C1. Accordingly, the inverter INV1 generates an initial setting signal of high level, and the set & reset circuit 2 generates a low-level output from its output terminal OUT1. Thus, the internal circuit of the semiconductor integrated circuit is initially set to this low level. Subsequently, when the voltage level of the electric power source Vcc increases and exceeds the setting voltage Vcc0, the internal power source circuit 1 supplies the voltage of the electric power source Vcc from its output terminal 11, with electric charges supplied to and stored in the capacitor C1. Hence, the voltage level of the output node A becomes a high level. Thus, the output of the INV1 is changed from high level to low level, thereby prohibiting the initial setting signal from being generated. As a result, the set & reset circuit 2 changes the level of its output terminal OUT1 in response to the levels of the signal lines B and C. In short, the operating condition of the internal circuit of the semiconductor integrated circuit is varied in response to the levels of the signal lines B and C.

When the electric power source is momently interrupted due to power failure or the like, the voltage level of the electric power source Vcc may drop for a while. Thus, the level of the output node A may be reduced to the threshold voltage Vt4 of the transistor Tr4 in the same manner as in the second embodiment, although the level of the output node A is normally maintained at the threshold voltage Vt5 of the feedback switching means Tr5. Thereafter, even if the voltage level of the electric power source Vcc starts increasing, the output voltage of the internal power source circuit 1 is kept at 0 v unless the voltage level of the electric power source Vcc reaches the setting voltage Vcc0. Hence, even if the feedback switching means Tr5 is turned on, the level of the output node A will be maintained at a low level and, therefore, the inverter INV1 surely generates the initial setting signal of high level. Subsequently, when the voltage level of the electric power source Vcc reaches and exceeds the setting voltage Vcc0, the voltage of the electric power source Vcc is applied to the capacitor C1 through the output terminal 11 of the internal power source circuit 1. Thus, the capacitor C1 is charged and the level of the output node A is turned to a high level. The output of the inverter INV1 is reset from high level to low level. Hence, the set & reset circuit 2 changes the level of its output terminal OUT1 in response to the levels of the signal lines B and C. Namely, the operating condition of the internal circuit of the semiconductor integrated circuit is varied in response to the levels of the signal lines B and C.

Accordingly, the present embodiment is characterized in that the internal power source circuit 1 generates from its output terminal 11 an output signal acting as one shot signal when the electric power unit is turned on or in the event of momentary interruption of electric power supply or the like, and performs the set and reset operation of the initial condition for the internal circuit of the semiconductor integrated circuit.

In this fourth embodiment, the capacitor C2 adopted in the third embodiment shown in FIG. 5 is not necessary because the capacitor C1 performs the function of the capacitor C2 too.

(Fifth Embodiment)

Hereinafter, a fifth embodiment of the present invention will be explained with reference to FIG. 7.

Figure 7:
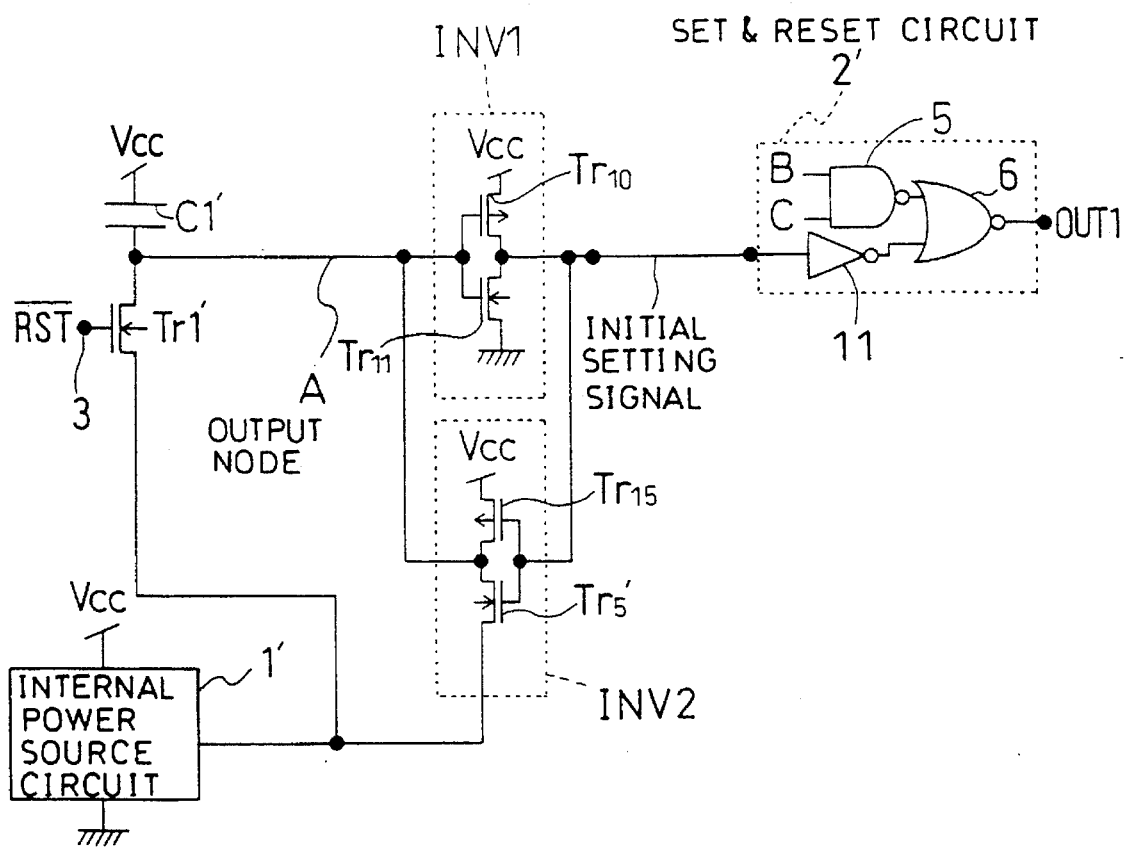
FIG. 7 is a circuit diagram showing an initial value setting circuit in accordance with a fifth embodiment of the present invention.
Figure 8:
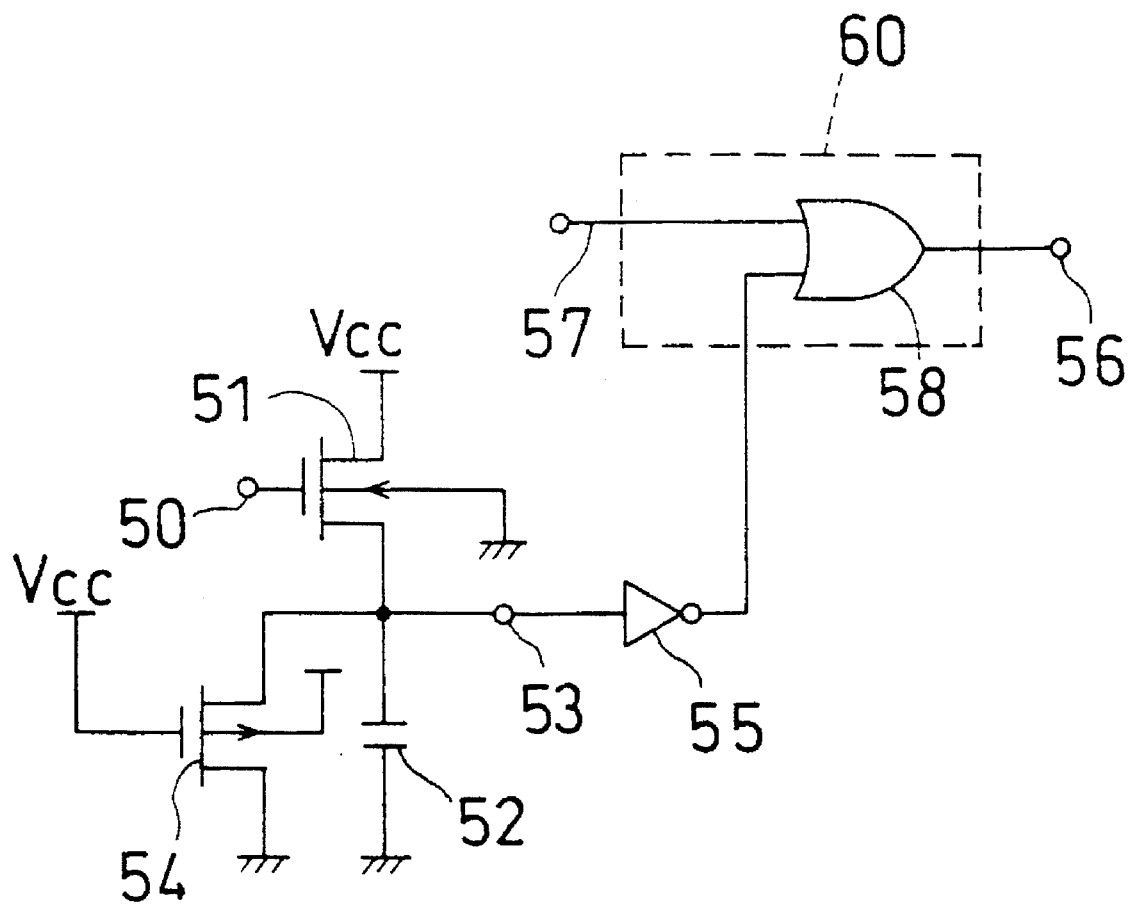
FIG. 8 is a circuit diagram showing a conventionally available initial value setting circuit.
Figure 9:
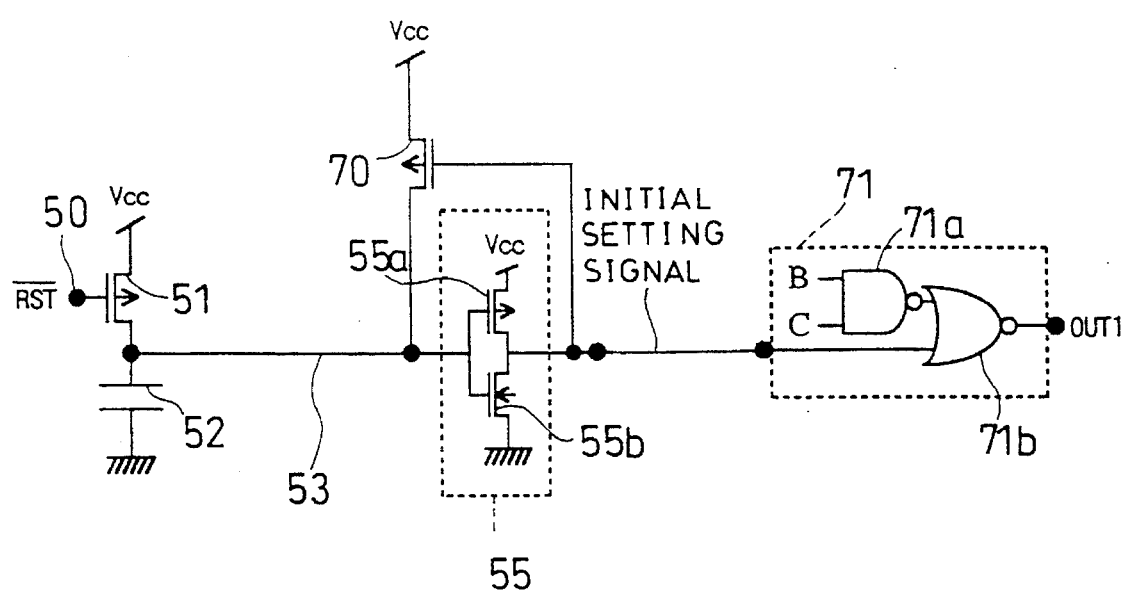
FIG. 9 is a circuit diagram showing a modified initial value setting circuit as an improvement of FIG. 8 circuit.
Figure 10:
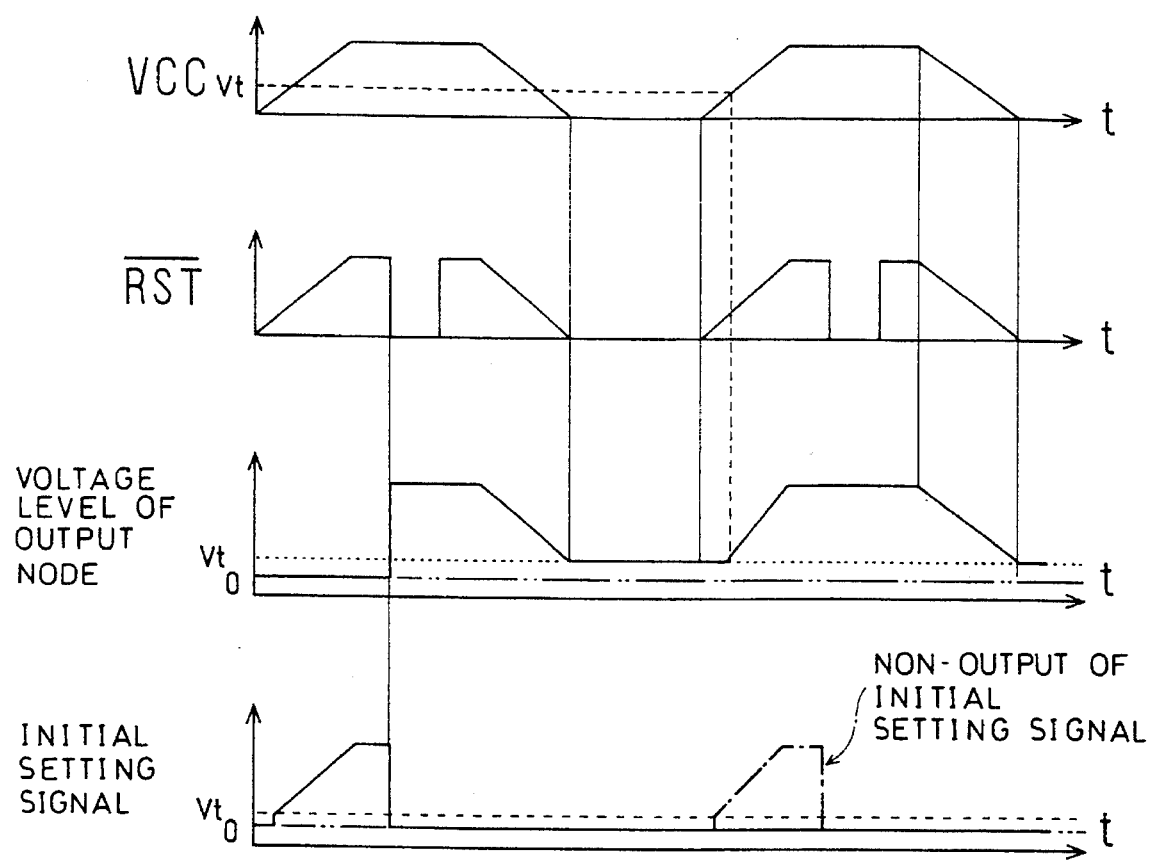
FIG. 10 is a view illustrating an operation of the initial value setting circuit shown in FIG. 9.

An initial value setting circuit shown in FIG. 7 is different from the first embodiment circuit of FIG. 1 in that the initial-condition-reset switching means Tr1 and the feedback switching means Tr5 are constituted by N-channel transistors instead of P-channel transistors, and voltage relation is opposite to that of FIG. 1.

More specifically, in FIG. 7, one end of a capacitor C1' is connected to the electric power source, and an initial-condition-reset switching means Tr1' has a source connected to the ground through an internal power source circuit 1'. A feedback switching means Tr5' (N-channel transistor) constitutes a feedback inverter INV2 together with a P-channel transistor Tr15. The inverter INV1 generates an output entered through an inverter 21 to the NOR circuit 6 of a set & reset circuit 2'. Other structural features are the same as those of FIG. 1. Identical parts are denoted by identical reference numeral, and will not be explained again.

According to this embodiment, when the electric power unit is turned on, the initial-condition-reset signal/RST is in a low level in the beginning. At this moment, the initial-condition-reset switching means Tr1' is turned off, and the level of the output node A becomes a high level. Thus, the inverter INV1 generates an initial setting signal of low level. Hence, the set & reset circuit 2' generates a low-level signal from its output terminal OUT1, thereby setting the internal circuit of the semiconductor integrated circuit in a low-level condition as an initial setting. After that, the voltage level of the output node A is maintained at the same level by the function of the feedback switching means Tr15 so as to maintain the initial setting condition.

Thereafter, when the initial-condition-reset signal/RST becomes a high level, the initial-condition-reset switching means Tr1' is turned on and the output node A becomes a low level. Thus, the inverter INV1 generates a high-level output signal to stop generation of the initial setting signal. Hence, the set & reset circuit 2' changes the level of its output terminal OUT1 in response to the levels of the signal lines B and C. Namely, the operating condition of the internal circuit of the semiconductor integrated circuit is varied in response to the levels of the signal lines B and C.

In the event of momentary interruption of electric power supply or the like, the voltage level of the initial setting signal may drop in the beginning of reduction of the electric power source voltage due to discharge from the transistor Tr10 of the inverter INV1 to the electric power source (0 v). This discharge is ceased at the moment that the voltage level of the initial setting signal is decreased down to a threshold voltage Vt10 of the transistor Tr10 constituting the inverter INV1. That is, the voltage level of the initial setting signal is held at the threshold voltage Vt10.

If the voltage level of the electric power source Vcc is raised, the inverter INV2 will generate a high-level output signal in response to turning-on of the N-channel transistor Tr5' in the absence of the internal power circuit 1' as was so in the conventional circuit. In such a case, the voltage level of the output node A becomes a low level because its electric charge is discharged to the ground through the activated transistor Tr5'. Thus, the inverter INV1 maintains a high-level output and, therefore, the initial setting signal (low level) is no longer generated.

However, according to the present embodiment, the feedback switching means Tr5' is isolated from the ground by the presence of the internal power source circuit 1'. Therefore, even if the feedback switching means Tr5' is turned on, the discharge from the output node A to the ground through the feedback switching means Tr5' is surely prevented. Hence, the output node A becomes a high level due to the coupling with the capacitor C1'. As a result, the inverter INV1 generates an initial setting signal of low level, and the internal circuit of the semiconductor integrated circuit is univocally set to a low-level condition as an initial setting.

Although not shown in the drawing, the initial value setting circuit of the present embodiment shown in FIG. 7 can employ the improvements shown in FIGS. 4A, 4B and 5A.

As this invention may be embodied in several forms without departing from the spirit of essential characteristics thereof, the present embodiments as described are therefore intended to be only illustrative and not restrictive, since the scope of the invention is defined by the appended claims rather than by the description preceding them, and all changes that fall within the metes and bounds of the claims, or equivalents of such metes and bounds, are therefore intended to be embraced by the claims.

What is claimed is:

1. An initial value setting circuit comprising:

an output node;

a capacitor for setting a voltage level of said output node to a predetermined initial setting level;

an initial-condition-reset switching means, controlled by an initial-condition-reset signal supplied from an external device, for setting the voltage level of said output node to another setting level different from said predetermined initial setting level;

an inverter having an input stage connected to said output node and an output stage generating a voltage level opposed to the voltage level of said output node;

a feedback switching means, controlled by an output of said inverter, for maintaining the voltage level of said output node; and a limiting means for limiting operations of said initial-condition-reset switching means and said feedback switching means until a voltage level of an electric power source reaches a predetermined threshold level assuring a normal operation of said inverter, when the voltage level of the electric power source is increased up to a specified value in response to turning-on operation of said electric power source.

2. The initial value setting circuit defined by claim 1, wherein said limiting means functions as said initial-condition-reset switching means, and said limiting means limits the operation of said feedback switching means until the voltage level of the electric power source reaches the predetermined threshold level assuring a normal operation of said inverter, when the voltage level of the electric power source is increased up to the specified value in response to turning-on operation of said electric power source.

3. The initial value setting circuit defined by claim 1, wherein said limiting means is connected to the electric power source, and is activated when the voltage level of the electric power source reaches the predetermined threshold level assuring a normal operation of said inverter, thereby applying the voltage of said electric power source to said feedback switching means and said initial-condition-reset switching means.

4. The initial value setting circuit defined by claim 2, wherein said limiting means is connected to the electric power source, and is activated when the voltage level of the electric power source reaches the predetermined threshold level assuring a normal operation of said inverter, thereby applying the voltage of said electric power source to said feedback switching means.

5. The initial value setting circuit defined by claim 3 or 4, wherein said limiting means comprises a current mirror circuit consisting of a pair of MOS transistors connected to the electric power source, and at least one conductive-voltage-setting MOS transistor connected to one MOS transistor of said current mirror circuit, for determining a boundary voltage of turning-on and off the other MOS transistor of said current mirror circuit connected to an output terminal.

6. The initial value setting circuit defined by claim 3 or 4, wherein said limiting means is connected to another capacitor for assuring a smooth building-up of an output voltage of said limiting means.

7. The initial value setting circuit defined by claim 1, 2, 3 or 4, wherein said feedback switching means is constituted by a MOS transistor, and another MOS transistor is interposed between said output node and the electric power source, said another MOS transistor having a threshold voltage lower than that of the MOS transistor constituting said feedback switching means.

* * * * *

UNITED STATES PATENT AND TRADEMARK OFFICE
CERTIFICATE OF CORRECTION

PATENT NO. : 5,523,710
DATED : June 4, 1996
INVENTOR(S) : Miyake et al.

It is certified that error appears in the above-identified patent and that said Letters Patent is hereby corrected as shown below:

Column 2, line 19, change "tile" " to --the--; and
        line 39, change "she" to --the--.

Column 3, line 19, change "58" to --53--; and
        line 27, change "5S" to --55--.

Column 5, line 36, change "EMBODIMENT" to --EMBODIMENTS--; and
        line 64, change "Tr10" to --MOS--.

Column 7, line 25, change "set reset" to --set & reset--.

Signed and Sealed this

Thirteenth Day of June, 2000

*Attest:*

Q. TODD DICKINSON

*Attesting Officer*      *Director of Patents and Trademarks*